United States Patent
Biederman et al.

(10) Patent No.: US 9,728,494 B2
(45) Date of Patent: Aug. 8, 2017

(54) BODY-MOUNTABLE DEVICE WITH A COMMON SUBSTRATE FOR ELECTRONICS AND BATTERY

(71) Applicant: Verily Life Sciences LLC, Mountain View, CA (US)

(72) Inventors: William James Biederman, Fox Island, WA (US); Daniel James Yeager, Berkeley, CA (US); Brian Otis, Saratoga, CA (US)

(73) Assignee: Verily Life Sciences LLC, Mountain View, CA (US)

( * ) Notice: Subject to any disclaimer, the term of this patent is extended or adjusted under 35 U.S.C. 154(b) by 0 days.

(21) Appl. No.: 14/863,510

(22) Filed: Sep. 24, 2015

(65) Prior Publication Data

US 2017/0092566 A1    Mar. 30, 2017

(51) Int. Cl.
*H01L 23/495* (2006.01)
*H01L 23/48* (2006.01)
(Continued)

(52) U.S. Cl.
CPC ........ *H01L 23/49593* (2013.01); *H01L 23/12* (2013.01); *H01L 23/13* (2013.01);
(Continued)

(58) Field of Classification Search
CPC ......... H01L 23/12; H01L 23/13; H01L 23/14; H01L 23/145; H01L 23/147;
(Continued)

(56) References Cited

U.S. PATENT DOCUMENTS

2004/0029311 A1  2/2004  Snyder et al.
2005/0158619 A1*  7/2005  Honda .............. H01M 10/0436
                                                             429/161
(Continued)

FOREIGN PATENT DOCUMENTS

WO  WO 2010/043991 A1  4/2010

OTHER PUBLICATIONS

International Search Report issued in co-pending International Application No. PCT/US2016/041854, European Patent Office, dated Sep. 22, 2016, 6 pages.
(Continued)

*Primary Examiner* — Eduardo A Rodela
(74) *Attorney, Agent, or Firm* — McDonnell Boehnen Hulbert & Berghoff LLP (57) ABSTRACT

An example device includes a silicon substrate having a first substrate surface and a second substrate surface; a plurality of layers associated with one or more electronic components of an integrated circuit (IC), where the plurality of layers are deposited on the second substrate surface; a lithium-based battery having a plurality of battery layers deposited on the first substrate surface of the silicon substrate, where the lithium-based battery includes an anode current collector and a cathode current collector; a first through-silicon via (TSV) passing through the silicon substrate and providing an electrical connection between the anode current collector and the plurality of layers associated with the one or more electronic components of the IC; and a second TSV passing through the silicon substrate and providing an electrical connection between the cathode current collector and the plurality of layers associated with the one or more electronic components of the IC.

20 Claims, 7 Drawing Sheets

(51) Int. Cl.
  *H01L 25/16* (2006.01)
  *H01L 23/14* (2006.01)
  *H01L 23/13* (2006.01)
  *H01L 23/12* (2006.01)

(52) U.S. Cl.
  CPC .......... *H01L 23/145* (2013.01); *H01L 23/147* (2013.01); *H01L 23/481* (2013.01); *H01L 25/16* (2013.01)

(58) Field of Classification Search
  CPC ......... H01L 23/49593; H01L 23/49827; H01L 23/49883; H01L 23/538; H01L 23/5384
  See application file for complete search history.

(56) References Cited

U.S. PATENT DOCUMENTS

| | | |
|---|---|---|
| 2007/0238019 A1 | 10/2007 | Laurent et al. |
| 2007/0275300 A1 | 11/2007 | Salot et al. |
| 2011/0186990 A1* | 8/2011 | Mawatari ............ H01L 23/3677 257/737 |
| 2012/0208054 A1 | 8/2012 | Shirasawa et al. |
| 2012/0274273 A1 | 11/2012 | Jacobs et al. |
| 2013/0194540 A1* | 8/2013 | Pugh .................... A61F 2/1635 351/159.03 |
| 2014/0035155 A1* | 2/2014 | Tan ........................ H01L 23/58 257/774 |
| 2014/0091748 A1 | 4/2014 | Hermann |
| 2014/0162139 A1 | 6/2014 | Hoshiba et al. |
| 2014/0227609 A1 | 8/2014 | Frey et al. |
| 2015/0084157 A1* | 3/2015 | Tegen .................. H01L 21/822 257/528 |
| 2016/0037631 A1* | 2/2016 | Payne .................. H05K 1/0306 174/251 |

OTHER PUBLICATIONS

Written Opinion issued in co-pending International Application No. PCT/US2016/041854, European Patent Office, dated Sep. 22, 2016, 8 pages.

* cited by examiner

BODY-MOUNTABLE DEVICE WITH A COMMON SUBSTRATE FOR ELECTRONICS AND BATTERY

BACKGROUND

Microelectronic components are widely used in the production of a variety of electronic devices (e.g., wearable computing device, portable computers, mobile device, etc.). Development of such microelectronic devices has brought about the evolution of batteries as miniature power supplies. Such batteries can be, for example, lithium-based batteries.

SUMMARY

The present disclosure describes embodiments that relate to methods, devices, and systems associated with a common substrate for electronics and a battery. In one aspect, the present disclosure describes a device. The device includes a silicon substrate having a first substrate surface and a second substrate surface opposite the first substrate surface. The device also includes a plurality of layers associated with one or more electronic components of an integrated circuit, where the plurality of layers are deposited on the second substrate surface. The device further includes a lithium-based battery having a plurality of battery layers deposited on the first substrate surface of the silicon substrate. The lithium-based battery includes an anode current collector and a cathode current collector defined within the plurality of battery layers and contacting the first substrate surface. The device also includes a first through-silicon via (TSV) passing through the silicon substrate and providing an electrical connection between the anode current collector and the plurality of layers associated with the one or more electronic components of the integrated circuit. The first TSV includes a first conductive channel insulated from the silicon substrate by a first insulating layer surrounding the first conductive channel. The device further includes a second TSV passing through the silicon substrate and providing an electrical connection between the cathode current collector and the plurality of layers associated with the one or more electronic components of the integrated circuit. The second TSV includes a second conductive channel insulated from the silicon substrate by a second insulating layer surrounding the second conductive channel.

In another aspect, the present disclosure describes a method. The method includes providing a silicon substrate having a first substrate surface and a second substrate surface opposite the first substrate surface. The method also includes depositing a plurality of layers associated with one or more electronic components of an integrated circuit on the second substrate surface. The method further includes depositing a plurality of battery layers of a lithium-based battery on the first substrate surface of the silicon substrate. The lithium-based battery includes an anode current collector and a cathode current collector defined within the plurality of battery layers and contacting the first substrate surface. The method also includes forming a first TSV in the silicon substrate to provide an electrical connection between the anode current collector and the plurality of layers associated with the one or more electronic components of the integrated circuit. The first TSV comprises a first conductive channel insulated from the silicon substrate by a first insulating layer surrounding the first conductive channel. The method further includes forming a second TSV in the silicon substrate to provide an electrical connection between the cathode current collector and the plurality of layers associated with the one or more electronic components of the integrated circuit. The second TSV comprises a second conductive channel insulated from the silicon substrate by a second insulating layer surrounding the second conductive channel.

In still another aspect, the present disclosure describes a system. The system includes a silicon substrate having a first substrate surface and a second substrate surface opposite the first substrate surface. The system also includes one or more electronic components coupled to the second substrate surface. The system further includes a lithium-based battery having a plurality of battery layers deposited on the first substrate surface of the silicon substrate such that the silicon substrate is configured as a common substrate for the one or more electronic components and the lithium-based battery. The lithium-based battery includes an anode current collector and a cathode current collector defined within the plurality of battery layers and contacting the first substrate surface. The system also includes a first TSV passing through the silicon substrate and providing an electrical connection between the anode current collector and the plurality of layers associated with the one or more electronic components, and a second TSV passing through the silicon substrate and providing an electrical connection between the cathode current collector and the plurality of layers associated with the one or more electronic components. The system further includes an additional substrate having one or more conductive traces in electrical communication with the one or more electronic components via a conductive adhesive.

The foregoing summary is illustrative only and is not intended to be in any way limiting. In addition to the illustrative aspects, embodiments, and features described above, further aspects, embodiments, and features will become apparent by reference to the figures and the following detailed description.

DETAILED DESCRIPTION

The following detailed description describes various features and functions of the disclosed systems and methods with reference to the accompanying figures. The illustrative system and method embodiments described herein are not meant to be limiting. It may be readily understood that certain aspects of the disclosed systems and methods can be arranged and combined in a wide variety of different configurations, all of which are contemplated herein.

Further, unless context suggests otherwise, the features illustrated in each of the figures may be used in combination with one another. Thus, the figures should be generally viewed as component aspects of one or more overall implementations, with the understanding that not all illustrated features are necessary for each implementation.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

I. OVERVIEW

Body-mountable electronic devices are increasing in complexity and may include a plurality of electronic components, sensors, transceivers, and one or more batteries. Disclosed herein are methods, devices, and systems relating to electrically and mechanically connecting the battery with an active area of a silicon substrate while facing away from the substrate. These methods, devices, and systems further involve the battery and other electronic components sharing a common substrate so as to reduce complexity of device fabrication and mitigate effects of battery expansion during charging.

Particularly, a battery may be fabricated on, or bonded to, a back side of an integrated circuit (IC). The battery may thus share the substrate of the IC instead of having its own substrate. As an example for illustration, a complementary metal-oxide semiconductor (CMOS) chip may be fabricated on a silicon substrate, which is also a substrate that could be used for making solid state lithium batteries. In this example, the CMOS chip and the battery could share the same substrate. The anode and cathode current collectors of the battery may then be connected to electronic components of the chip by way of through-silicon vias (TSVs) disposed within the substrate. Generally, a TSV is a vertical electrical connection (via) passing through a silicon wafer or die. A TSV provides an interconnect technique used as an alternative to wire-bond and flip-chip techniques.

Thus, the battery may share a common substrate with other components of an IC, and may provide power to the components using the TSVs. This construction is more efficient and may reduce complexity of device fabrication and the number of assembly steps for making the device, thus reducing cost and improving manufacturing yield.

II. EXAMPLE DEVICES

Figure 1:
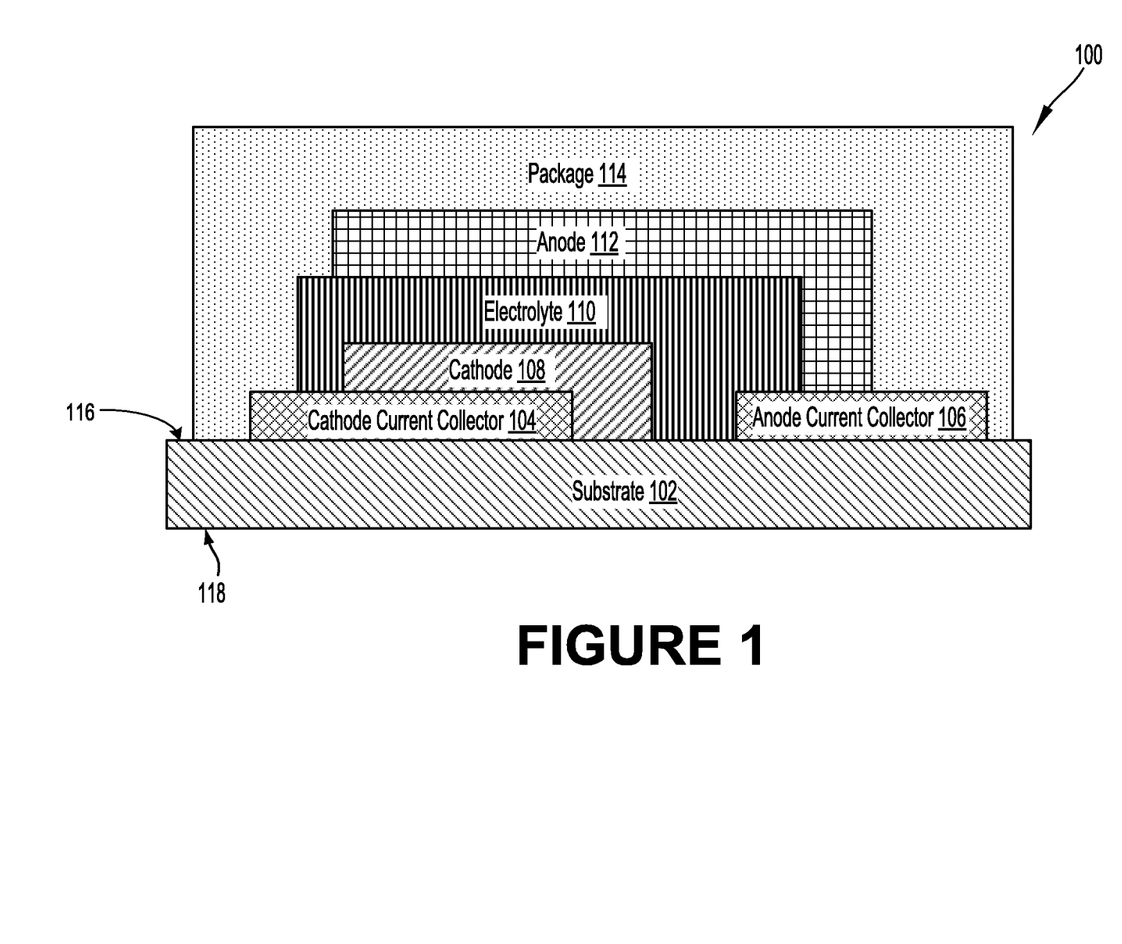
FIG. 1 illustrates a lithium-based battery, in accordance with an example implementation.

FIG. 1 illustrates a lithium-based battery 100, in accordance with an example implementation. More particularly, FIG. 1 shows example battery layers of the lithium-based battery 100. As shown in FIG. 1, the lithium-based battery 100 may include the following layers: (1) a substrate 102 (e.g., a silicon substrate); (2) a cathode current collector 104; (3) an anode current collector 106; (4) a cathode 108; (5) an electrolyte 110; (6) an anode 112; and (7) a package (or protective coating) 114. These materials and layers are examples for illustration only. Other configurations of battery layers could be used in a lithium-based battery.

As mentioned above, to reduce complexity of a device, the lithium-based battery 100 could share the substrate 102 with other electronic components. For example, the substrate 102 could also be a substrate of an IC, where the battery layers are deposited on a surface 116 of the substrate 102, and layers of the electronic components of the IC are deposited on an opposite surface 118. Such construction is shown in FIG. 2.

Figure 2:
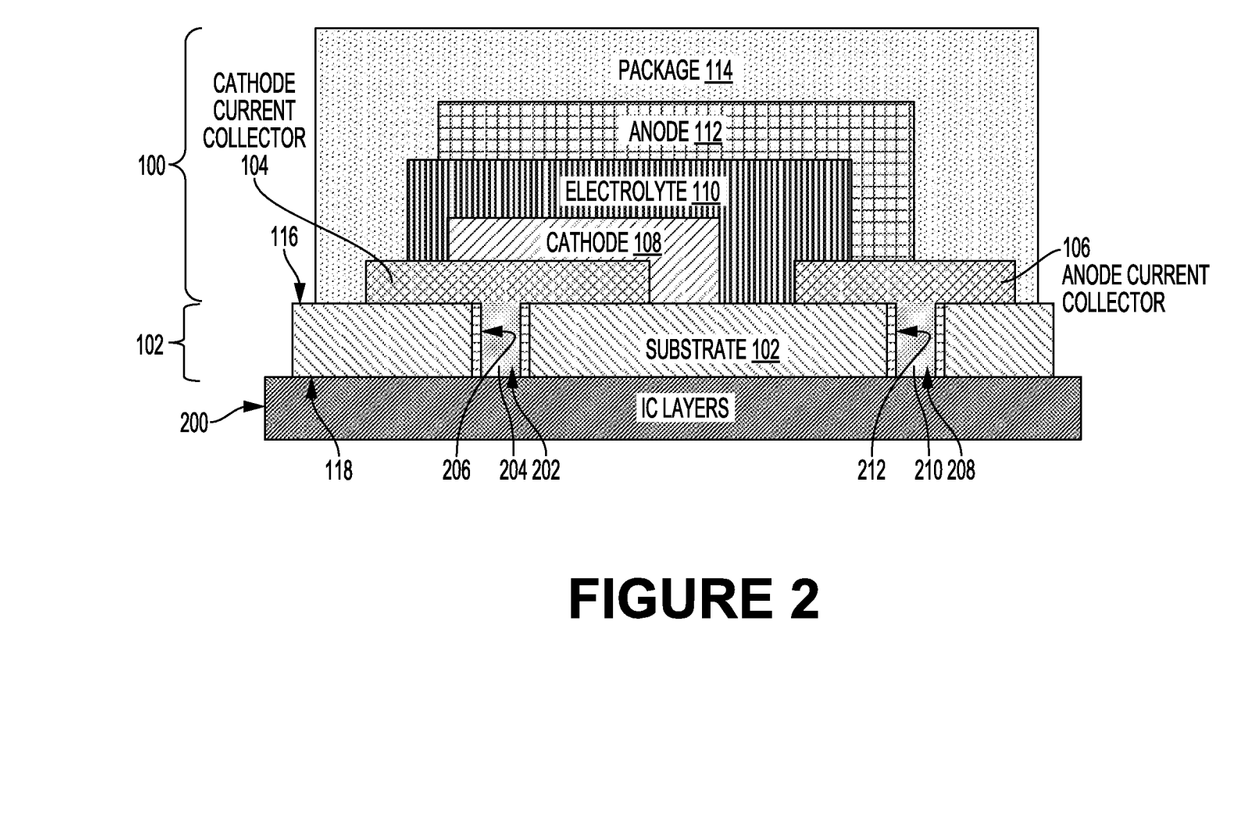
FIG. 2 illustrates a lithium-based battery sharing a common substrate with layers of an integrated circuit, in accordance with an example implementation.

FIG. 2 illustrates the lithium-based battery 100 sharing the substrate 102 with layers 200 of an IC, in accordance with an example implementation. As shown in FIG. 2, the layers 200 of the IC are deposited on the surface 118 of the substrate 102. As examples, the layers 200 may be associated with electronic components such as sensors, antennae, memory chips, etc.

As shown in both FIGS. 1 and 2, the cathode current collector 104 and the anode current collector 106 are both defined within the layers of the lithium-based battery 100 and are configured to contact the surface 116 of the substrate 102. A first TSV 202 passes through the substrate 102 and is configured to electrically connect the cathode current collector 104 to the layers 200 of the IC.

The TSV 202 includes a conductive channel 204 made of a conductive material (e.g., gold, nickel, etc.). The conductive channel 204 is insulated from the substrate 102 by an insulating layer 206 (e.g., a dielectric material) surrounding the conductive channel 204.

Similarly, a second TSV 208 passes through the substrate 102 and is configured to electrically connect the anode current collector 106 to the layers 200 of the IC. The TSV 208 includes a conductive channel 210 made of a conductive material. The conductive material of the conductive channel 210 may be similar to the conductive material of the conductive channel 204, for example. The conductive channel 210 is insulated from the substrate 102 by an insulating layer 212 surrounding the conductive channel 210. Thus, the lithium-based battery 100 and the layers 200 of the IC share the same substrate 102, and the lithium-based battery 100 provides electric power to the electronic components of the IC using the TSVs 202 and 208. This construction eliminates redundancy of having one substrate for the lithium-based battery 100, and another substrate for the IC, thus reducing complexity and cost of fabricating electronic devices.

Further, the configuration shown in FIG. 2 may mitigate effects of battery expansion during charging. A solid-state lithium-ion battery, such as the lithium-based battery 100, may be manufactured such that little or no elemental lithium is present in the battery when the battery is uncharged. This can be useful in situations where the battery will be integrated into another device that undergoes further processing. In particular, the presence of lithium may be undesirable in further processing steps that include exposure to oxygen, moisture, and/or heat conditions.

During charging, however, lithium is produced and may be plated between the anode and the electrolyte of the battery. Also, charging the lithium-based battery may produce pressure and heat inside the lithium-based battery. Production of lithium and/or generation of pressure and heat, or other factors, may cause the battery to swell or expand during charging. The expansion can cause considerable stress and strain in a structure of the lithium-based battery.

Figure 3:
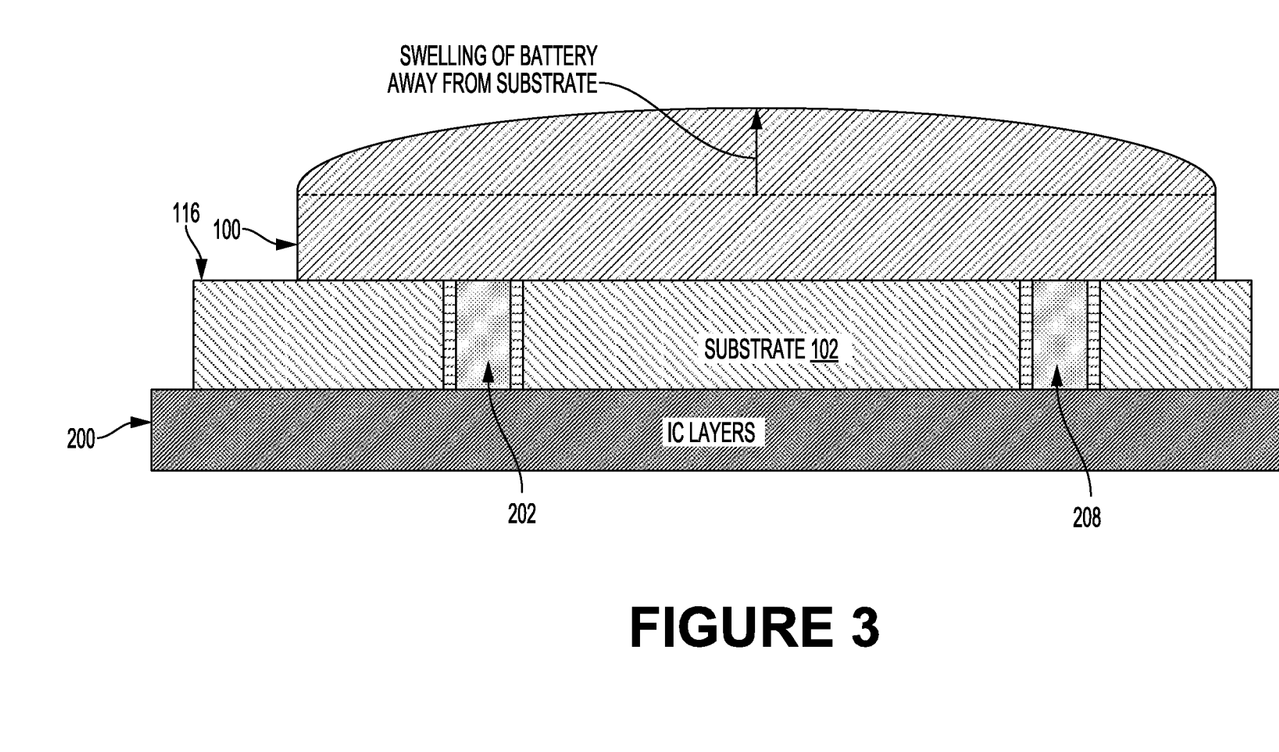
FIG. 3 illustrates expansion of a lithium-based battery during charging, in accordance with an example implementation.

FIG. 3 illustrate expansion of the lithium-based battery 100 during charging, in accordance with an example implementation. As shown in FIG. 3, the layers of the lithium-based battery 100 are deposited on the surface 116 such that the outward bulging resulting from expansion of the lithium-based battery 100 is directed away from the substrate 102. Thus, expansion of the lithium-based battery 100 during charging might not affect or interfere with operation of the lithium-based battery 100 or the IC, and the structure of the lithium-based battery 100 might not be stressed.

III. EXAMPLE SYSTEMS

In examples, the device illustrated in FIGS. 1-3 can be integrated into other systems. For instance, the IC and the lithium-based battery 100 could be coupled to other devices having other electronic components. These other devices may have their own substrates, and the layers 200 of the IC may be electrically coupled to a substrate of another device. This way, the lithium-based battery 100 and the electronic components of the IC may be electrically coupled with electronic components of the other device.

Figure 4:
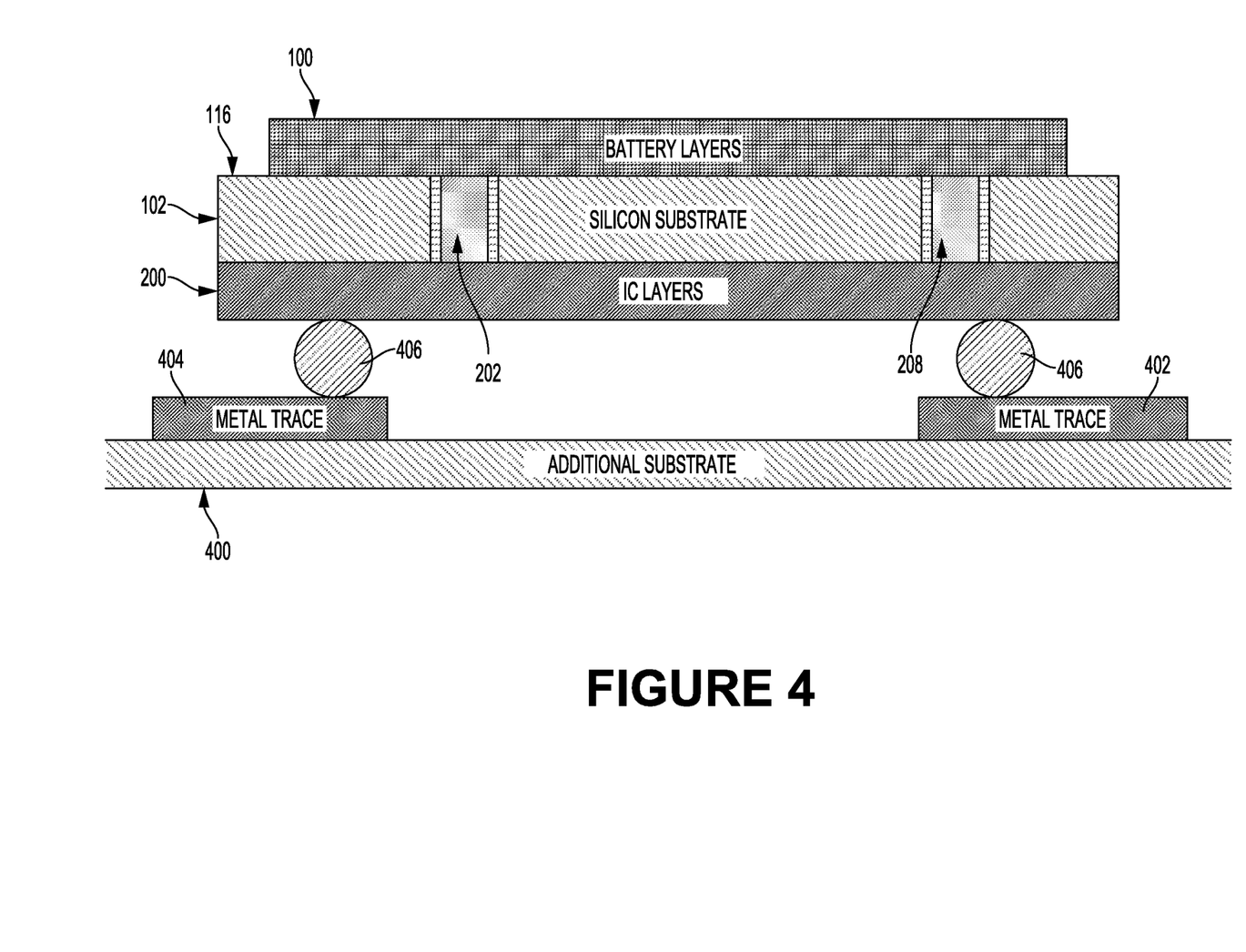
FIG. 4 illustrates electrical coupling of layers of an integrated circuit to an additional substrate, in accordance with an example implementation.

FIG. 4 illustrates coupling the layers 200 of the IC to an additional substrate 400, in accordance with an example implementation. The additional substrate 400 may be associated with other structures or devices having electronic components such as application specific ICs (ASICs), sensors, other batteries, antennae, chips, etc. The additional substrate 400 may be made of a polymeric material (e.g., parylene), for example.

The additional substrate 400 may have one or more conductive traces such as conductive traces 402 and 404. The conductive traces 402 and 404 may be configured to carry electric signals to and from electronic components (not shown) associated with the additional substrate 400. To achieve electric contact with the layers 200 of the IC, the conductive traces 402 and 404 may be coupled via an electrically-conductive adhesive 406 to the layers 200.

The adhesive 406 can take several forms. For instance, the adhesive 406 may take the form of a film applied to the conductive traces 402 and 404. In another example, the adhesive 406 may be applied as drops to the conductive traces 402 and 404 and/or corresponding traces (not shown) coupled to the layers 200. In examples, the adhesive 406 may be flexible to allow relative motion between the layers 200 and the additional substrate 400. However, in other examples, the adhesive 406 may be rigid.

In an example, the adhesive 406 may include an anisotropic conductive paste (ACP). The ACP may include an epoxy-based adhesive containing metallic particles. However, in other examples, the adhesive 406 may include isotropically conductive adhesive material such as a polymeric material containing metallic particles (e.g., silver flakes). Other adhesives could be used as well.

In a specific example, the additional substrate 400 may be embeddable into a body-mountable device, such as an eye-mountable device (i.e., contact lens) or any other body-mountable sensing platform. In this case, the additional substrate 400 may represent a bio-compatible substrate that could be embedded within a body-mountable device.

Figure 5:
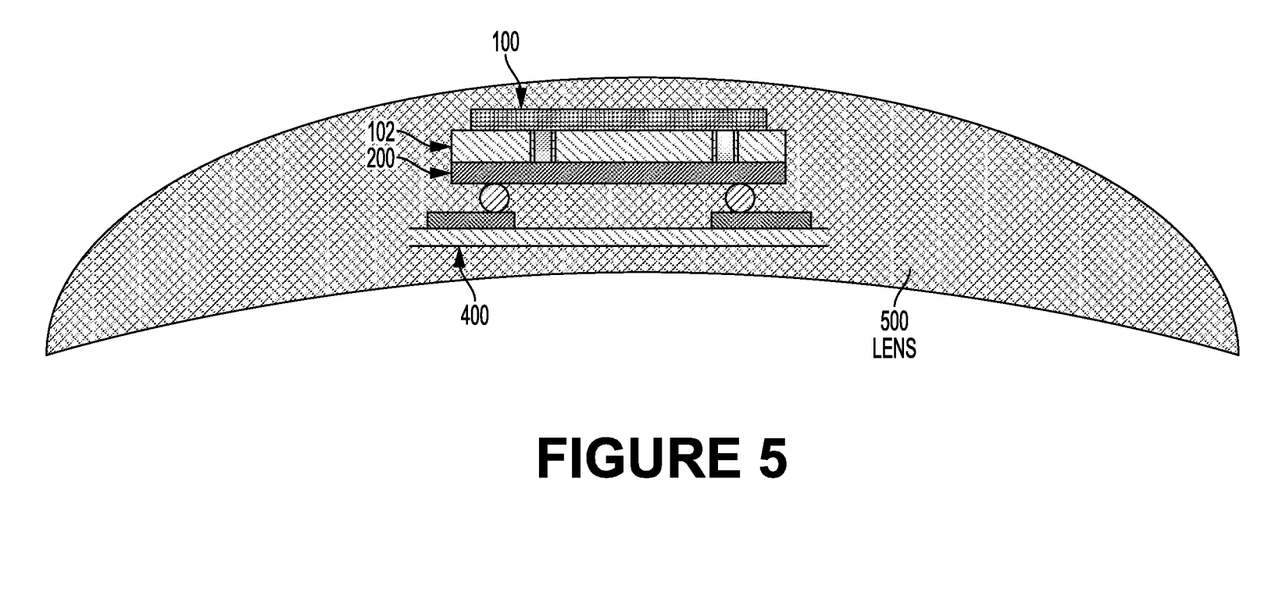
FIG. 5 illustrates an eye-mountable device, in accordance with an example implementation.

FIG. 5 illustrates an eye-mountable device 500, in accordance with an example implementation. As shown in FIG. 5, the additional substrate 400 to which the layers 200, the substrate 102, and the lithium-based battery 100 are coupled, is embedded within the eye-mountable device 500. Although the additional substrate 400 is depicted as mounted in a central portion of the eye-mountable device 500, the additional substrate 400 can be mounted in other portions. Also, the depiction in FIG. 5 is not meant to be to scale. The additional substrate 400 and other components attached thereto may have a size that is smaller than the size shown in FIG. 5 relative to the eye-mountable device 500. For instance, the size may be sufficiently small and the additional substrate 400 may be embedded toward a peripheral part of the eye-mountable device 500 so as to not block a line of sight of a wearer of the eye-mountable device 500.

In examples, the eye-mountable device 500 may be made of a polymeric material. The additional substrate 400, the layers 200, the substrate 102, and the lithium-based battery 100 may be made of bio-compatible materials appropriate for an environment of contact lens, for example. The additional substrate 400 can be mounted to other portions of a body as illustrated in FIG. 6.

Figure 6:
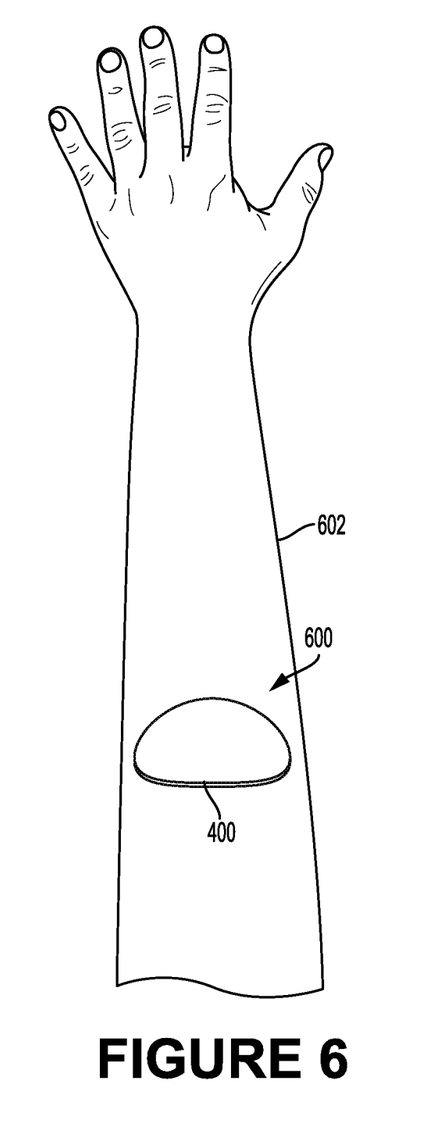
FIG. 6 illustrates a body-mountable device, in accordance with an example implementation.

FIG. 6 illustrates a body-mountable device 600, in accordance with an example implementation. The body-mountable device 600 may, for example, be mounted on an arm 602, or other portions of a body of a wearer. The additional substrate 400 may be made as a flexible substrate, as shown in FIG. 6, and may be mountable to a skin surface of the arm 602. Sensors and associated sensor probes may be mounted to or disposed on or within the additional substrate 400 to detect one or more physiological properties of skin. Example physiological properties include a concentration of an analyte in interstitial fluid within the skin. Sensor measurements can be then be communicated for further processing through the conductive traces 402 and 404 to the layers 200 associated with the IC sharing the substrate 200 with the lithium-based battery 100 (not shown in FIG. 6).

IV. EXAMPLE METHODS

Figure 7:
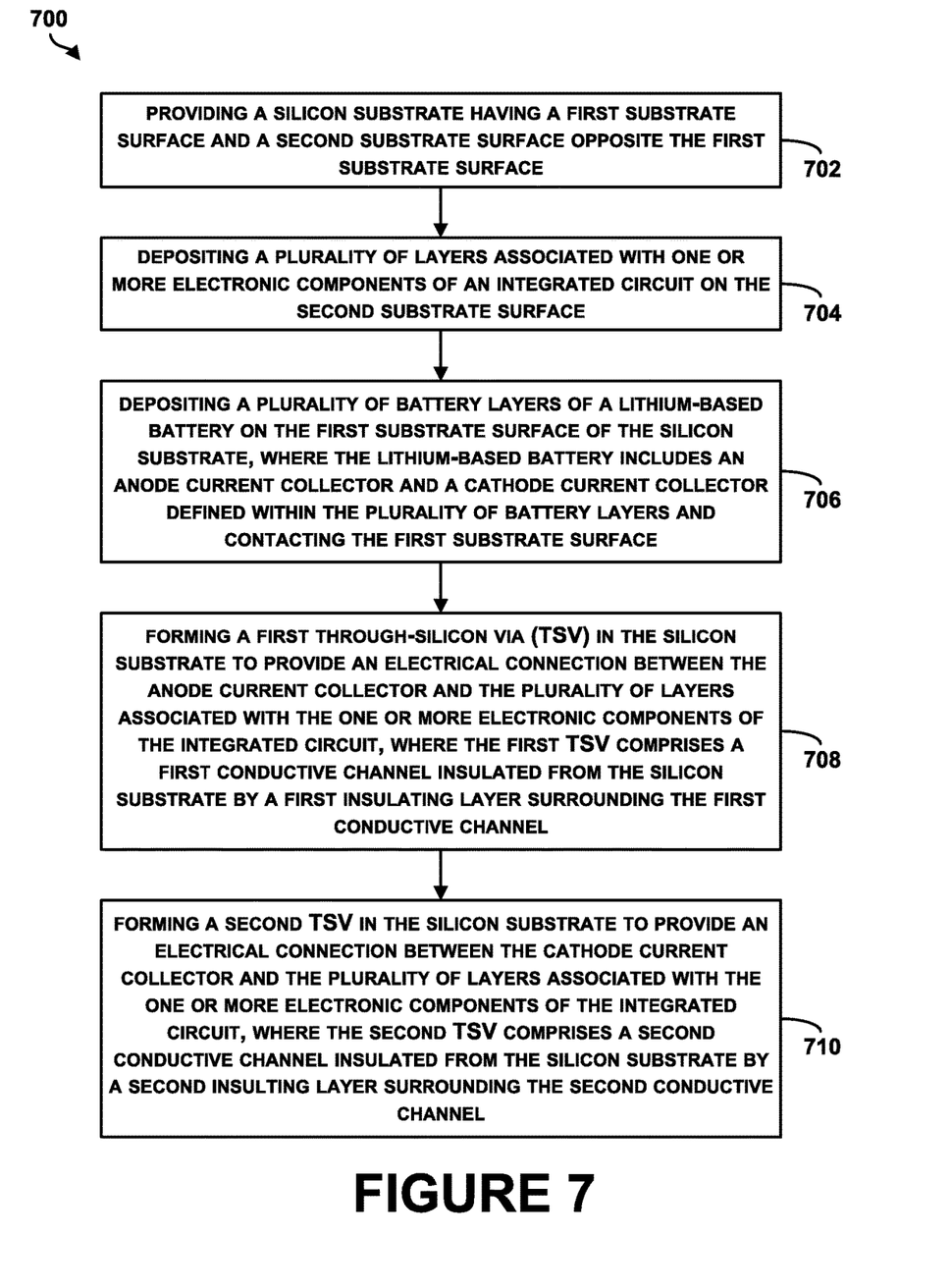
FIG. 7 is a flow chart of a method for making a device with a common substrate for battery and electronics, in accordance with an example implementation.

FIG. 7 is a flow chart of a method 700 for making a device with a common substrate for battery and electronics, in accordance with an example implementation. The method 700 may include one or more operations or actions as illustrated by one or more of blocks 702-710. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

At block 702, the method 700 includes providing a silicon substrate having a first substrate surface and a second substrate surface opposite the first substrate surface. The term "providing" as used herein with regard to a silicon substrate includes any action to make the silicon substrate available for use, such as bringing the silicon substrate to an apparatus or to a work environment for further processing of the silicon substrate (e.g., for depositing layers on the silicon substrate, coupling the silicon substrate to another component, etc.).

In line with the discussion related to FIGS. 1-6, a silicon substrate, such as the substrate 102, may be configured to have a first surface and a second surface opposite the first surface. The silicon substrate may be configured as a common substrate for a battery and other electronic components of an IC. In examples, the silicon substrate may include glass-ceramics to enable the silicon substrate to withstand heat during further processing or operations of the method 700.

At block 704, the method 700 includes depositing a plurality of layers associated with one or more electronic components of an IC on the second substrate surface. Layers, such as the layers 200, associated with electronic components of an IC may be deposited on the second surface of the silicon substrate. The electronic components may include sensors, transceivers, antennae, etc. The layers of the electronic components can be deposited using microfabrication and/or manufacturing techniques such as, for example, electroplating, photolithography, deposition, and/ or evaporation fabrication processes and the like. The layers may be formed according to patterns using photoresists and/or masks to pattern materials in particular arrangements, such as to form wires, electrodes, electrical contacts, etc.

At block 706 of the method 700, the method includes depositing a plurality of battery layers of a lithium-based battery on the first substrate surface of the silicon substrate. A lithium-based battery, such as the battery 100, may include a plurality of layers. Example layers include a cathode current collector, an anode current collector, a cathode, an electrolyte, an anode, and a protective package or coating. As described with respect to FIG. 2, the anode current collector and the cathode current collector may be defined within the plurality of battery layers of the lithium-based battery and may be configured to contact the first substrate surface of the silicon substrate (opposite to the layers of the electronic components).

The lithium-based battery may be of a type that, during charging, experiences swelling or expansion. For instance, during charging, lithium is produced and is plated between the anode and the electrolyte of the lithium-based battery. Production of lithium, or other factors, causes the lithium-based battery to swell or expand. The expansion can cause considerable stress and strain in a structure of the lithium-based battery. The layers of the lithium-based battery are deposited on the first surface of the silicon substrate such that the outward bulging resulting from expansion of the lithium-based battery is directed away from the silicone substrate. In this manner, the expansion of the lithium-based battery during charging might not affect operation of, or stress, the lithium-based battery or the IC.

At block 708 of the method 700 includes forming a first TSV in the silicon substrate to provide an electrical connection between the anode current collector and the plurality of layers associated with the one or more electronic components of the IC, where the first TSV comprises a first conductive channel insulated from the silicon substrate by a first insulating layer surrounding the first conductive channel. As mentioned above, a TSV is a vertical electrical connection passing through a silicon wafer or die.

Forming the first TSV may include machining a channel or a hollow pipe with near-vertical sidewalls through a thickness of the silicon substrate. A dielectric film may be applied to the sidewalls of the channel to form the first insulating layer. The dielectric film may be overlaid with conductive metal and/or the conductive metal may fill the channel. The conductive metal may thus form the first conductive channel that establishes an electric pathway between the anode current collector and the plurality of layers of the one or more electronic components of the IC. Other manufacturing techniques could be used to form the first TSV.

At block 710 of the method 700 includes forming a second TSV in the silicon substrate to provide an electrical connection between the cathode current collector and the plurality of layers associated with the one or more electronic components of the IC, where the second TSV comprises a second conductive channel insulated from the silicon substrate by a second insulating layer surrounding the second conductive channel.

The techniques described at block 708 for forming the first TSV can also be used to form a second TSV to establish an electric pathway between the cathode current collector of the lithium-based battery and the layers associated with the electronic components of the integrate circuit.

In examples, the method 700 may further include coupling the plurality of layers associated with the one or more electronic components of the IC to an additional substrate of a body-mountable device. As described with respect to FIGS. 5 and 6, the coupling may include electrically connecting conductive traces disposed on the additional substrate to the electronic components of the IC. For instance, an ACP may be applied to the conductive traces disposed on the additional substrate and/or applied to corresponding conductive traces of the electronic components of the IC. When the additional substrate is coupled to the electronic components, the ACP provides a conductive pathway therebetween. In examples, the ACP could be an epoxy-based adhesive containing metallic particles. However, other isotropic or anisotropic adhesives could be used as well.

Also, as shown in FIG. 5, the body-mountable device could be an eye-mountable contact lens. In other implementations, the body-mountable device may take other forms such as skin-mounted patches, as shown in FIG. 6, for example.

V. CONCLUSION

It should be understood that arrangements described herein are for purposes of example only. As such, those skilled in the art will appreciate that other arrangements and other elements (e.g., machines, interfaces, orders, and groupings of operations, etc.) can be used instead, and some elements may be omitted altogether according to the desired results.

While various aspects and implementations have been disclosed herein, other aspects and implementations will be apparent to those skilled in the art. The various aspects and implementations disclosed herein are for purposes of illustration and are not intended to be limiting, with the true scope being indicated by the following claims, along with the full scope of equivalents to which such claims are entitled. It is also to be understood that the terminology used herein is for the purpose of describing particular implementations only, and is not intended to be limiting.

What is claimed is:

1. A device comprising:
    a silicon substrate having a first substrate surface and a second substrate surface opposite the first substrate surface;
    a plurality of layers associated with one or more electronic components of an integrated circuit, wherein the plurality of layers are deposited on the second substrate surface;
    a lithium-based battery having a plurality of battery layers deposited on the first substrate surface of the silicon substrate, wherein the lithium-based battery includes an anode current collector and a cathode current collector defined within the plurality of battery layers and contacting the first substrate surface, and wherein the plurality of battery layers includes an electrolyte layer in direct contact with the first substrate surface, the cathode current collector, and the anode current collector;
    a first through-silicon via (TSV) passing through the silicon substrate and providing an electrical connection between the anode current collector and the plurality of layers associated with the one or more electronic components of the integrated circuit, wherein the first TSV comprises a first conductive channel insulated from the silicon substrate by a first insulating layer surrounding the first conductive channel; and
    a second TSV passing through the silicon substrate and providing an electrical connection between the cathode current collector and the plurality of layers associated with the one or more electronic components of the integrated circuit, wherein the second TSV comprises a second conductive channel insulated from the silicon substrate by a second insulating layer surrounding the second conductive channel.

2. The device of claim 1, wherein the lithium-based battery is a type that undergoes an expansion during charging in which the expansion of the lithium-based battery causes an outward bulging, and wherein the plurality of battery layers are deposited on the first substrate surface such that the outward bulging is directed away from the silicon substrate.

3. The device of claim 2, wherein the lithium-based battery further includes at least an anode layer, and wherein the expansion during charging is caused at least in part by production of lithium between the anode layer and the electrolyte layer during charging.

4. The device of claim 1, further comprising:
an additional substrate having one or more conductive traces coupled via a conductive adhesive to the plurality of layers associated with the one or more electronic components of the integrated circuit.

5. The device of claim 4, wherein the conductive adhesive includes an anisotropic conductive paste (ACP).

6. The device of claim 4, wherein the additional substrate is associated with an eye-mountable contact lens.

7. The device of claim 1, wherein the electrolyte layer is partially disposed between an anode layer and a cathode layer such that the cathode layer is in direct contact with the electrolyte layer, the first substrate surface, and the cathode current collector, whereas the anode layer is in direct contact with the anode current collector and the electrolyte layer without contacting the first substrate surface.

8. The device of claim 1, wherein the integrated circuit comprises a complementary metal-oxide semiconductor (CMOS) chip.

9. A method comprising:
providing a silicon substrate having a first substrate surface and a second substrate surface opposite the first substrate surface;
depositing a plurality of layers associated with one or more electronic components of an integrated circuit on the second substrate surface;
depositing a plurality of battery layers of a lithium-based battery on the first substrate surface of the silicon substrate, wherein the lithium-based battery includes an anode current collector and a cathode current collector defined within the plurality of battery layers and contacting the first substrate surface, and wherein the plurality of battery layers includes an electrolyte layer in direct contact with the first substrate surface, the cathode current collector, and the anode current collector;
forming a first through-silicon via (TSV) in the silicon substrate to provide an electrical connection between the anode current collector and the plurality of layers associated with the one or more electronic components of the integrated circuit, wherein the first TSV comprises a first conductive channel insulated from the silicon substrate by a first insulating layer surrounding the first conductive channel; and
forming a second TSV in the silicon substrate to provide an electrical connection between the cathode current collector and the plurality of layers associated with the one or more electronic components of the integrated circuit, wherein the second TSV comprises a second conductive channel insulated from the silicon substrate by a second insulating layer surrounding the second conductive channel.

10. The method of claim 9, wherein the lithium-based battery is a type that undergoes an expansion during charging in which the expansion of the lithium-based battery causes an outward bulging, and wherein depositing the plurality of battery layers on the first substrate surface is such that the outward bulging is directed away from the silicon substrate.

11. The method of claim 10, wherein the lithium-based battery further includes at least an anode layer, and wherein the expansion during charging is caused at least in part by production of lithium between the anode layer and the electrolyte layer during charging.

12. The method of claim 9, further comprising:
coupling the plurality of layers associated with the one or more electronic components of the integrated circuit to an additional substrate of a body-mountable device.

13. The method of claim 12, wherein the additional substrate includes one or more conductive traces, and wherein the coupling includes coupling the one or more conductive traces to the plurality of layers via an anisotropic conductive paste (ACP).

14. The method of claim 9, wherein the electrolyte layer is partially disposed between an anode layer and a cathode layer such that the cathode layer is in direct contact with the electrolyte layer, the first substrate surface, and the cathode current collector, whereas the anode layer is in direct contact with the anode current collector and the electrolyte layer without contacting the first substrate surface.

15. The method of claim 14, wherein the anode current collector and the cathode current collector are in contact with a battery protective packaging layer, and wherein the battery protective packaging layer is further in contact with the first substrate surface, the electrolyte layer, and the anode layer without contacting the cathode layer.

16. A system comprising:
a silicon substrate having a first substrate surface and a second substrate surface opposite the first substrate surface;
one or more electronic components coupled to the second substrate surface;
a lithium-based battery having a plurality of battery layers deposited on the first substrate surface of the silicon substrate such that the silicon substrate is configured as a common substrate for the one or more electronic components and the lithium-based battery, wherein the lithium-based battery includes an anode current collector and a cathode current collector defined within the plurality of battery layers and contacting the first substrate surface, and wherein the plurality of battery layers includes an electrolyte layer in direct contact with the first substrate surface, the cathode current collector, and the anode current collector;
a first through-silicon via (TSV) passing through the silicon substrate and providing an electrical connection between the anode current collector and the plurality of layers associated with the one or more electronic components, and a second TSV passing through the silicon substrate and providing an electrical connection between the cathode current collector and the plurality of layers associated with the one or more electronic components; and
an additional substrate having one or more conductive traces in electrical communication with the one or more electronic components via a conductive adhesive.

17. The system of claim 16, wherein the conductive adhesive comprises an anisotropic conductive paste (ACP) containing metallic particles.

18. The system of claim 16, wherein the first TSV comprises a first conductive channel insulated from the silicon substrate by a first insulating layer surrounding the first conductive channel, and wherein the second TSV comprises a second conductive channel insulated from the silicon substrate by a second insulating layer surrounding the second conductive channel.

19. The system of claim 16, wherein the additional substrate is associated with an eye-mountable contact lens.

20. The system of claim 16, wherein the one or more electronic components include an integrated circuit.

* * * * *